United States Patent [19]
Engel et al.

[11] Patent Number: 5,627,718
[45] Date of Patent: May 6, 1997

[54] APPARATUS PROVIDING PROTECTION AND METERING IN AN AC ELECTRICAL SYSTEM UTILIZING A MULTI-FUNCTION SAMPLING TECHNIQUE

[75] Inventors: Joseph C. Engel, Monroeville; Gary F. Saletta, Irwin; Richard A. Johnson, Hopewell Township, all of Pa.

[73] Assignee: Eaton Corporation, Cleveland, Ohio

[21] Appl. No.: 342,208

[22] Filed: Nov. 18, 1994

[51] Int. Cl.$^6$ ........................................... H02H 3/18
[52] U.S. Cl. ............... 361/97; 361/79; 324/120; 324/76.58; 324/500; 341/123
[58] Field of Search ............... 364/480–493; 324/119–120, 76.58, 500, 509, 512, 535; 341/122–123; 361/93–97, 88–89, 62–63, 65, 67, 78–80

[56] References Cited

U.S. PATENT DOCUMENTS

| | | | |
|---|---|---|---|
| 4,672,555 | 6/1987 | Hart et al. | 364/483 |
| 5,060,166 | 10/1991 | Engel et al. | 364/487 |
| 5,233,538 | 8/1993 | Wallis | 364/483 |

Primary Examiner—Jeffrey A. Gaffin
Assistant Examiner—Michael J. Sherry
Attorney, Agent, or Firm—Martin J. Moran

[57] ABSTRACT

A circuit interrupter samples waveforms in a protected circuit by taking samples in pairs spaced 90 electrical degrees apart. The sum of the squares of samples in each pair, which is representative of the RMS value of the fundamental frequency of the waveform, is used for instantaneous protection by comparing a running sum of the squares for the two most recent pairs of samples to a threshold representative of the instantaneous trip pick-up value. This sum of the squares of successive two pairs of samples is also used for short delay protection. A delay between successive pairs of samples is varied to produce a selected equivalent sampling rate after a given number of samples. Samples accumulated at this equivalent sampling rate, which is sixty-four samples per cycle in the preferred embodiment, are used for long delay protection and metering.

13 Claims, 7 Drawing Sheets

APPARATUS PROVIDING PROTECTION AND METERING IN AN AC ELECTRICAL SYSTEM UTILIZING A MULTI-FUNCTION SAMPLING TECHNIQUE

BACKGROUND OF THE INVENTION

1. Field of the Invention

This invention relates to digital protection and metering apparatus for ac electrical systems, and more particularly, to the manner in which the waveforms of the electrical system are sampled and used to provide protection and metering functions.

2. Background Information

State of the art electrical apparatus for providing protection, and or metering, functions in an ac electrical system typically incorporate microcomputers to perform the various required functions utilizing samples of current, and when needed voltages, in the electrical system. In addition to performing the necessary protection and metering calculations, the microcomputer also manages sampling of the waveforms to generate the digital information needed by the microcomputer. Sampling of the currents and voltages, especially in a three-phase system, occupies considerable time of the microcomputer. Thus, there are competing demands placed upon the microcomputer.

The problem is complicated by the fact that the sampling requirements of the different functions are different. For example, the current sampling or measurement requirements for the protective functions such as instantaneous, short time delay and long time delay are not only different among themselves, but also can be significantly different from those required for metering. The greatest difference is between the sampling requirements for instantaneous overcurrent protection and for metering.

Instantaneous protection implies no intentional delay between the time that the instantaneous trip level setting is exceeded and the time the trip unit opens the breaker. By necessity, this requires that only a few data points can be used to calculate the value of the current as the sampling and the ensuing digital calculations take time which must be limited if the trip is to occur in less than one cycle of the power line.

Conversely, the metering calculations do not need to be performed rapidly as time is not an issue. For instance, if the information is to be displayed on the unit, a display refresher update time of less than 250 ms is undesirable as a faster rate could make the digital display unreadable. Furthermore, if the current being measured is rich in harmonics, it is desirable to use a large number of sample points. All this might imply that the sampling rate suitable for performing the instantaneous protection function would also be suitable for the metering function by merely waiting until the large number of samples were gathered over several cycles. However, samples repetitively taken at the same point in the waveform during successive cycles do not provide the information needed for metering. The large number of samples must be spread over a cycle of the waveform in order to capture the harmonic content needed for accurate metering. On the other hand, if the sampling rate per cycle is made high enough to satisfy the metering requirements, the typical microcomputer which can be used economically in such apparatus cannot perform the required calculations on a real time basis.

One approach to this problem has been the development of equivalent sampling techniques. In an equivalent sampling technique, samples are taken at a selected number of samples per cycle which allows the microcomputer sufficient time to manage the sampling and perform its calculations, but sampling is delayed a fraction of a cycle between each repetition of the selected number of samples so that successive sets of samples are taken at different points in the waveform. Samples gathered over several repetitions are treated as having occurred in a single "equivalent cycle," thereby providing a higher "equivalent sampling rate." For example, where a waveform is sampled at sixteen samples per cycle with a "bump" or delay of $\frac{1}{64}$ of a cycle between repetitions, an equivalent sampling rate of sixty-four samples per cycle will be generated after four repetitions. Actually, this will occur in $4+\frac{1}{16}$ cycles rather than 4 cycles of the waveform; however, this is of no major significance in providing protection and metering functions.

It is known that the RMS value of a pure sinusoidal waveform can be determined from just two samples taken 90 electrical degrees apart, as discussed for example in U.S. Pat. No. 5,060,166. It is also known that large fault currents are limited by the source impedance of the power system, not by the load. The combination of a sinusoidal voltage producing generator and linear line impedance, resistive and inductive, yields nearly sinusoidal fault currents. Thus, two samples taken 90° apart can be used to provide instantaneous protection. However, samples taken 90 electrical degrees apart (relative to the fundamental frequency) do not capture the harmonics of the waveform which are needed for metering, and, in fact, for the long delay protection function also.

There is a need therefore for an improved protection and metering apparatus for electrical systems with a digital sampling technique which better meets the competing requirements of the various functions performed by the apparatus.

There is a related need for such a protection and metering apparatus having a sampling technique which can be performed by affordable microcomputers while leaving sufficient capacity for the microcomputer to perform all the calculations required for comprehensive protection and metering.

SUMMARY OF THE INVENTION

These needs and others are satisfied by the invention which is directed to a circuit interrupter which digitally samples waveforms in the protected circuit using a technique which produces rapid response for instantaneous protection while providing high accuracy for long delay protection and metering. More particularly, the circuit interrupter of the invention includes means generating sampling instants in pairs spaced 90 electrical degrees of the ac waveform apart. The values of the paired waveforms are squared and summed to generate a representation of the RMS value of the fundamental frequency of the waveform. Since as previously mentioned, fault currents are essentially sinusoidal, the paired samples provide a rapid measure of RMS current for instantaneous protection. In the preferred embodiment of the invention two pairs of samples with the pairs taken at different points on the waveform, are used for instantaneous protection to reduce sensitivity to spikes in the waveform.

In implementing the invention, processor means square and sum the values of the samples to generate a squared pair sum for each pair of samples. A running sum of the squared pair sum for each of the two most recent sample pairs is then used to trip the contacts open when the running sum exceeds a threshold value representative of the instantaneous trip pick-up value. The processor means also includes short delay protection means which trips the contacts open when the running sum exceeds the threshold value representative of a selected short delay pick-up value on every other pair of samples for a selected short delay interval.

The processor means also includes means repetitively generating an accumulated sum calculated by accumulating the value of the running sum at every other pair of samples for a given number of samples. The processor means further includes long delay protection means which trips the contacts open when the accumulated sum after the given number of samples exceeds a long delay threshold value representative of a long delay pick-up value for a predetermined period of time. In the exemplary embodiment of the invention, the given number of samples is 64, so that the accumulated sum is equal to the total value of the squares of the value of each of 64 samples. Preferably, the samples are generated with delays between successive pairs of samples adjusted to produce a selected equivalent sampling rate after the given number of samples, preferably with the given number of samples substantially evenly distributed over an equivalent sampling cycle. Preferably, the accumulated sum used for long delay protection is generated using samples taken at this equivalent sampling rate. Also, the samples taken at this equivalent sampling rate can be used for metering, as the higher rate of sampling produced by the equivalent sampling technique provides better accuracy in measurement of the waveforms. In the exemplary embodiment of the invention, the equivalent sampling rate is 64 samples per cycle.

In accordance with another aspect of the invention, a plurality of equivalent sampling rates, each with a given number of samples evenly distributed over an equivalent sampling cycle are produced. For example, in the exemplary embodiment of the invention equivalent sampling rates of 16 samples per cycle and 64 samples per cycle are generated. Preferably, the 64 sample per cycle equivalent sample is used for both metering and long delay protection. However, the 16 sample per cycle equivalent sampling rate could be used for long delay protection with the 64 sample per cycle equivalent sampling rate only used for the metering function.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
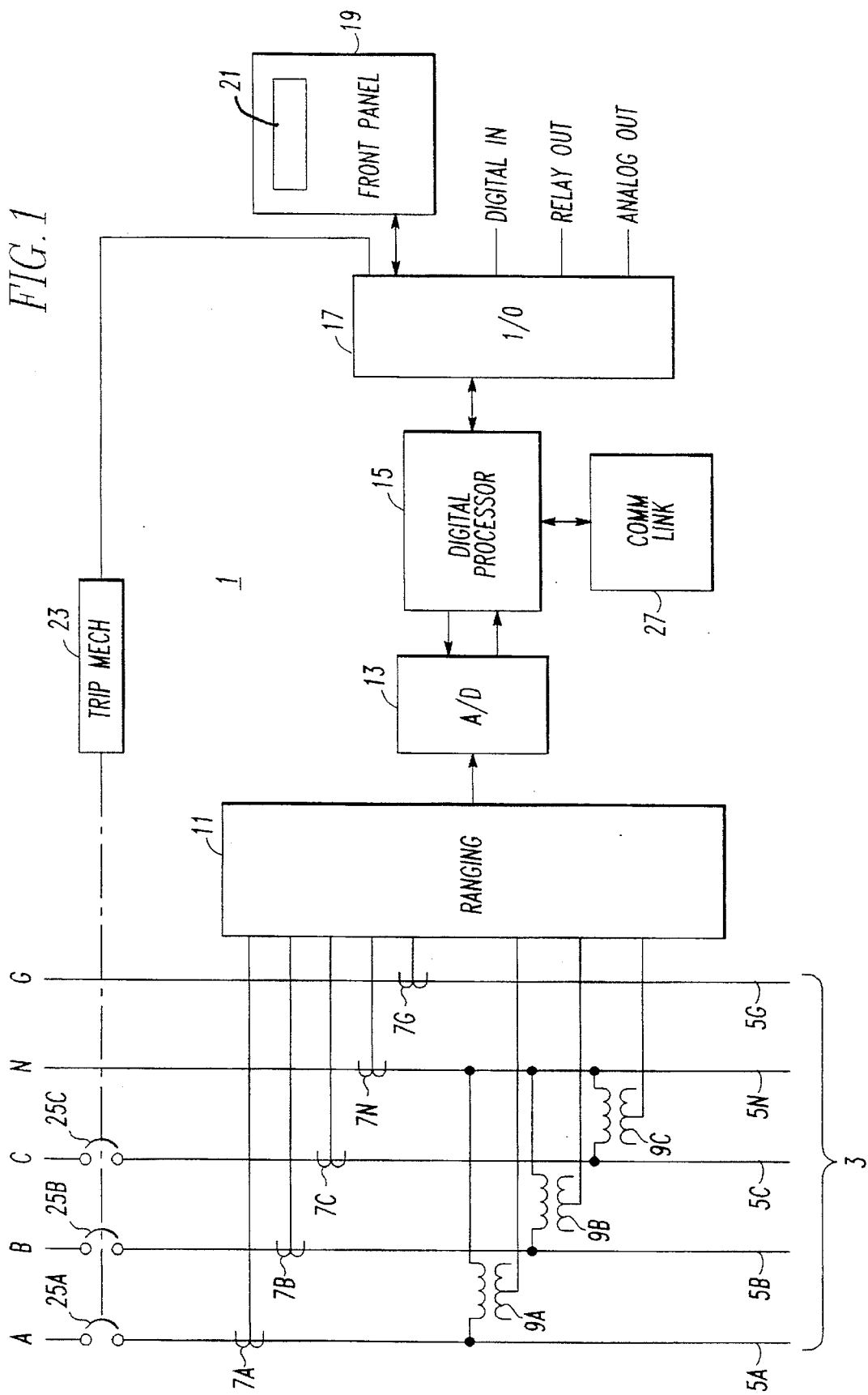
FIG. 1 is a schematic diagram primarily in block diagram form illustrating a circuit interrupter in accordance with the invention.

FIG. 1 illustrates a circuit breaker with metering 1 of the invention used for protection and metering in an ac electrical power system 3. The power distribution system 3 illustrated has three phase conductors, 5A, B and C, a neutral conductor 5N and a ground conductor 5G. Current transformers 7A, B, C, N and G sense current flowing in each of these conductors while phase to neutral voltages are sensed by the potential transformers 9A, B and C and neutral to ground voltage is sensed by transformer 9N. A ranging circuit 11 converts the current and voltage signals to a suitable range for conversion by analog to digital (A/D) converter 13 for input to a digital processor 15. The A/D convertor 13 samples analog voltages and currents at sampling rates determined by interrupts generated by the digital processor 15 in a manner to be described. The digital processor 15 utilizes the data generated by the digital samples to provide protection functions and in particular instantaneous, short-delay and long-delay protection for the electrical system 3, and also uses the samples for metering.

The digital processor 15 has an input/output (I/O) 17 through which the digital processor 15 communicates with a front panel 19. The front panel 19 serves as the interface with the user. It is through the front panel 19 that the user can control the operation of the circuit breaker/meter 1, and monitor the ac electrical power system 3. To this end, the front panel 19 has a display 21 on which the metered parameters can be presented to the user.

In implementing the protection functions, the digital processor 15 generates a trip signal when any one of the current/time characteristics of a protection function is exceeded. This trip signal is passed by the I/O 17 to a trip mechanism 23 which opens separable contacts 25A, B and C in the phase conductors 5A, B and C of the electrical system 3. Although typically not provided in the United States, additional separable contacts can be included to also interrupt current in the neutral conductor 5N and the ground conductor 5G.

The input/output device 17 also interfaces the digital processor 15 with contact inputs through a digital input. Relay outputs and analog outputs are also provided through the input/output device 17. The digital processor 15 can also communicate with a remote processor using a communications link 27 through which the circuit breaker/meter 1 can provide information to and/or be controlled by a remote processor (not shown).

The digital processor 15 controls sampling of the various current and voltage waveforms by the A/D convertor 13 by generating interrupts which establish the sampling instants. As mentioned above, the different protection functions and the metering functions have different sampling requirements. Instantaneous protection which trips the circuit breaker open in response to short circuits requires rapid response, while long-delay protection and metering do not require rapid response. Also as discussed previously, the short circuit currents to which the instantaneous trip responds are typically sinusoidal, while the long-delay function and metering need to take into account distortions in the waveform from a pure sinusoid. The rapid response to pure sinusoidal current required for instantaneous protection can be provided by pairs of samples of the fundamental frequency of the waveform taken 90 electrical degrees apart.

This can be shown as follows:

$$i(k) = I \sin(A) \quad \text{Eq. 1}$$

$$i(k+1) = I \sin(A+90) = I \cos(A) \quad \text{Eq. 2}$$

$$i(k)^2 + i(k+1)^2 = I^2(\sin(A)^2 + \cos(A)^2) \quad \text{Eq. 3}$$

$$= I^2 \quad \text{Eq. 4}$$

Since Irms is equal to $I/\sqrt{2}$, then:

$$Irms = \sqrt{\frac{i(k)^2 + i(k+1)^2}{2}} \quad \text{Eq. 5}$$

Thus, the peak value of the fundamental frequency of the ac waveform can be calculated from two samples taken 90° apart at any point in the waveform.

It can be seen from Eq. 5 that since calculation of the RMS value of the current requires taking the square root of ½ of the sum of the sample value squared, the squared values of the samples are proportional to the RMS value of the sinusoidal waveform. Thus, for protection purposes, it is not necessary to calculate the square root, which requires appreciable processor time. Instead, the sum of the squares of the samples in the pair can be compared to a threshold representative of the instantaneous pick-up current.

While a single pair of samples can be used for instantaneous protection, in the preferred embodiment of the invention a running sum is maintained of the sum of the squares of the two most recent pairs of samples. This reduces the risk of false trips based upon spikes in the waveform yet still provides very rapid response. Furthermore, the calculations required by the digital processor 15 are still minimal so that the processor has additional time to perform other functions. Also, by maintaining a running sum of the squares of the most recent two pairs of samples, an instantaneous trip can be generated by the first pair of samples taken after a fault if the fault current is large enough that the sum of four samples exceeds the instantaneous pickup threshold. This could also occur, for instance, where the fault occurs between the samples in a pair so that the values of the subsequent three samples, the second sample of the pair during which the fault occurs and the next successive pair, cause the sum of four samples to exceed the threshold value.

Two pairs of samples are also used in providing short delay protection. As typical short delay protection requires that the current remain above a threshold level, which is somewhat lower than the threshold for instantaneous protection, for a time period of about 0.1 to 0.5 seconds, for example, it is not necessary to calculate the current as rapidly as for instantaneous protection. Therefore, in the preferred embodiment of the invention, the sum of the squares, $S_4$, for the two most recent pairs of samples is only monitored for short delay protection on every other pair of samples, rather than on every pair of samples as for instantaneous protection. This leaves additional time for the processor to perform its other functions.

An important aspect of the invention is that a time delay is interposed between successive pairs of samples. This time delay is not a multiple of 90° so that successive pairs of samples are sampling different parts of the fundamental waveform. In fact, the delay between successive pairs of samples is not fixed but is adjusted to produce a desired equivalent sampling rate after a given number of samples. Equivalent sampling distributes a given number of samples taken over multiple cycles at angular instants in the waveform so that when superimposed on a single cycle, the samples are distributed, preferably evenly. The effect of concentrating all the samples in a single cycle is realized by repetitively waiting to use the samples until the given number has been gathered. Typically in equivalent sampling, a selected number of samples is taken per cycle with a consistent delay or "bump" between repetitions. In accordance with the present invention, the delay between successive pairs of samples is not constant, but does follow a repetitive pattern. In the exemplary embodiment of the invention, the spacing between successive pairs of samples is adjusted so that an equivalent sampling rate of 64 equally spaced samples per cycle is produced. The exemplary technique also produces an equivalent sampling rate of 16 equally spaced samples per cycle. Four patterns of sixteen samples per cycle are sequentially generated with phase shifts with respect to one another to produce the equivalent sampling rate of sixty-four evenly spaced samples per cycle.

As an alternative to using the equivalent sampling rate of 64 samples per cycle for both long delay protection and metering, the long delay calculations could be made using the 16 sample per cycle equivalent sampling rate. The higher, 64 samples per cycle, equivalent sampling rate is preferred because time is not critical in long delay protection and the 64 sample per cycle equivalent sampling rate takes into account more harmonics.

Table 1 illustrates the sampling technique as applied to a 60 Hz waveform. As can be seen from the table, each pair of samples, i.e., 0–1, 2–3, etc. are 90° or 4.166667 ms apart for 60 Hz. Each delay between pairs of samples assumes one of four values which are repeated in a sequence which produces an equivalent sampling rate of sixteen samples per cycle after sixteen samples and sixty-four evenly spaced samples per cycle after sixty-four samples. In Table 1, the sample count indicates the number of the sample. The "sixty-four equiv" value represents the position of the respective samples in the equivalent sampling cycle. For instance, sample "1" ends up in position 16 in the equivalent sampling cycle for the 64 sample per cycle equivalent sampling rate. The "bump" column represents the time delay between samples. It will be noted after every other sample the "bump" time, which is implemented after the sample, is 4.16667 ms which is the 90° between paired samples at 60 Hz. The "time" column indicates the time after the initial sample that the particular sample is taken. It can be seen that the total time for taking sixty-four samples of a 60 Hz waveform is 319.0104 ms or a little over nineteen cycles.

TABLE 1

| sample | time | bump | 64*eqiv | sin |
| --- | --- | --- | --- | --- |
| 0 | 0 | 4.166667 | 0 | 0 |
| 1 | 4.166667 | 6.25 | 16 | 1 |
| 2 | 10.41667 | 4.166667 | 40 | −0.70711 |
| 3 | 14.58333 | 5.208333 | 56 | −0.70711 |
| 4 | 19.79167 | 4.166667 | 12 | 0.92388 |
| 5 | 23.95833 | 6.25 | 28 | 0.382683 |
| 6 | 30.20833 | 4.166667 | 52 | −0.92388 |
| 7 | 34.375 | 7.291667 | 4 | 0.382683 |
| 8 | 41.66667 | 4.166667 | 32 | 2.79E-15 |
| 9 | 45.83333 | 6.25 | 48 | −1 |
| 10 | 52.08333 | 4.166667 | 8 | 0.707107 |
| 11 | 56.25 | 5.208333 | 24 | 0.707107 |
| 12 | 61.45833 | 4.166667 | 44 | −0.92388 |
| 13 | 65.625 | 6.25 | 60 | −0.38268 |
| 14 | 71.875 | 4.166667 | 20 | 0.92388 |
| 15 | 76.04167 | 4.947917 | 36 | −0.38268 |
| 16 | 80.98958 | 4.166667 | 55 | −0.77301 |
| 17 | 85.15625 | 6.25 | 7 | 0.634393 |
| 18 | 91.40625 | 4.166667 | 31 | 0.098017 |
| 19 | 95.57292 | 5.208333 | 47 | −0.99518 |

TABLE 1-continued

| sample | time | bump | 64*eqiv | sin |
| --- | --- | --- | --- | --- |
| 20 | 100.7813 | 4.166667 | 3 | 0.290285 |
| 21 | 104.9479 | 6.25 | 19 | 0.95694 |
| 22 | 111.1979 | 4.166667 | 43 | −0.88192 |
| 23 | 115.3646 | 7.291667 | 59 | −0.4714 |
| 24 | 112.6563 | 4.166667 | 23 | 0.77301 |
| 25 | 126.8229 | 6.25 | 39 | −0.63439 |
| 26 | 133.0729 | 4.16667 | 63 | −0.09802 |
| 27 | 137.2396 | 5.208333 | 15 | 0.995185 |
| 28 | 142.4479 | 4.166667 | 35 | −0.29028 |
| 29 | 146.6146 | 6.25 | 51 | −0.95694 |
| 30 | 152.8646 | 4.166667 | 11 | 0.881921 |
| 31 | 157.0313 | 4.947917 | 27 | 0.471397 |
| 32 | 161.9792 | 4.166667 | 46 | −0.98079 |
| 33 | 166.1458 | 6.25 | 62 | −0.19509 |
| 34 | 172.3958 | 4.166667 | 22 | 0.83147 |
| 35 | 176.5625 | 5.208333 | 38 | −0.55557 |
| 36 | 181.7708 | 4.166667 | 58 | −0.55557 |
| 37 | 185.9375 | 6.25 | 10 | 0.83147 |
| 38 | 192.1875 | 4.166667 | 34 | −0.19509 |
| 39 | 196.3542 | 7.291667 | 50 | −0.98079 |
| 40 | 203.6458 | 4.166667 | 14 | 0.980785 |
| 41 | 207.8125 | 6.25 | 30 | 0.19509 |
| 42 | 214.0625 | 4.166667 | 54 | −0.83147 |
| 43 | 218.2292 | 5.208333 | 6 | 0.55557 |
| 44 | 223.4375 | 4.166667 | 26 | 0.55557 |
| 45 | 227.6042 | 6.25 | 42 | −0.83147 |
| 46 | 233.8542 | 4.166667 | 2 | 0.19509 |
| 47 | 238.0208 | 4.947917 | 18 | 0.980785 |
| 48 | 242.9688 | 4.166667 | 37 | −0.4714 |
| 49 | 247.1354 | 6.25 | 53 | −0.88192 |
| 50 | 253.3854 | 4.166667 | 13 | 0.95694 |
| 51 | 257.5521 | 5.208333 | 29 | 0.290285 |
| 52 | 262.7604 | 4.166667 | 49 | −0.99518 |
| 53 | 266.9271 | 6.25 | 1 | 0.098017 |
| 54 | 273.1771 | 4.166667 | 25 | 0.634393 |
| 55 | 277.3438 | 7.291667 | 41 | −0.77301 |
| 56 | 284.6354 | 4.166667 | 5 | 0.471397 |
| 57 | 288.8021 | 6.25 | 21 | 0.881921 |
| 58 | 295.0521 | 4.166667 | 45 | −0.95694 |
| 59 | 299.2188 | 5.208333 | 61 | −0.29028 |
| 60 | 304.4271 | 4.166667 | 17 | 0.995185 |
| 61 | 308.5938 | 6.25 | 33 | −0.09802 |
| 62 | 314.8438 | 4.166667 | 57 | −0.63439 |
| 63 | 319.0104 | 4.947917 | 9 | 0.77301 |

Figure 2:
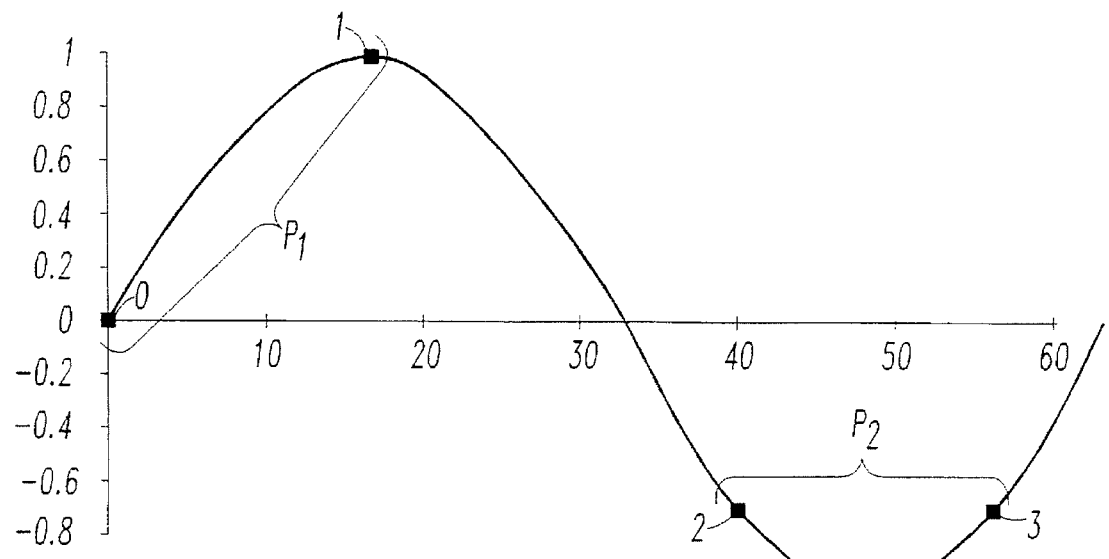
FIG. 2 is a diagram illustrating the distribution of two pairs of samples taken in accordance with the equivalent sampling technique of the invention.

FIG. 2 illustrates the angular distribution of the first four samples of the pattern set forth in Table 1 and represent the first two pairs of samples $P_1$ and $P_2$. It can be seen that these four samples are not evenly distributed over a cycle of the waveform; however, it will be remembered that each individual pair of samples generates a representation of the magnitude of the waveform no matter where along the waveform it is taken.

Figure 3A:
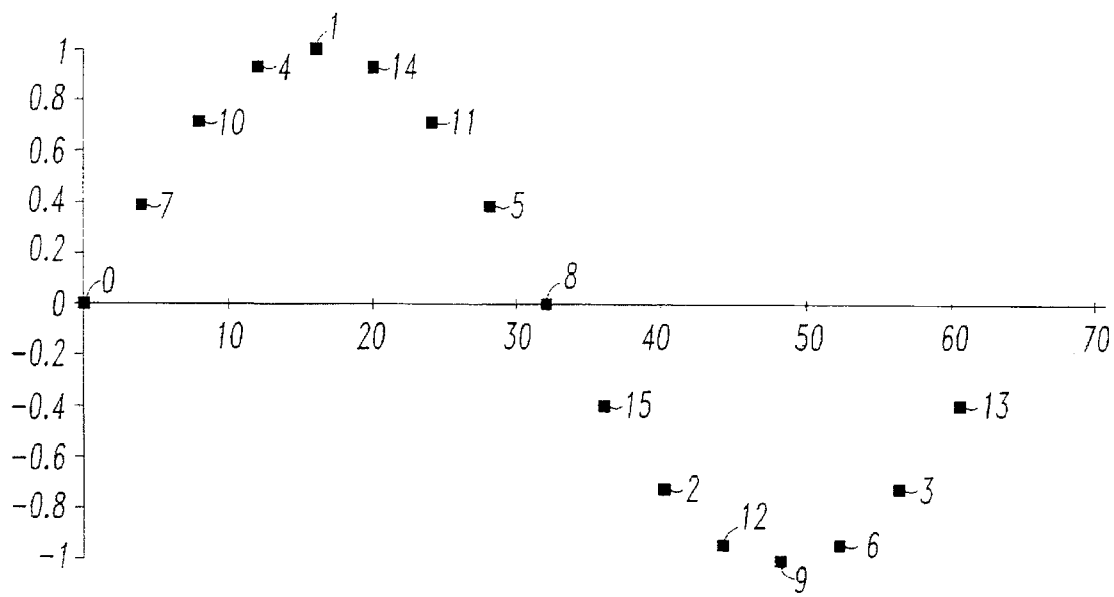
FIGS. 3A–D are diagrams illustrating repetitions of a sixteen sample per cycle equivalent sampling rate using pairs of samples in accordance with the invention.
Figure 3B:
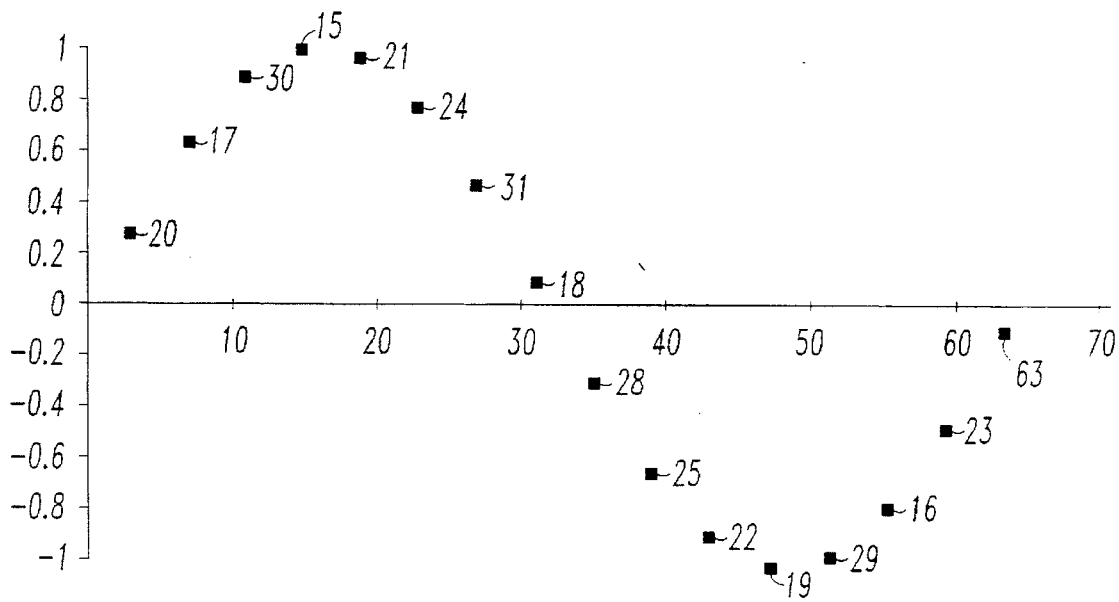
Figure 3C:
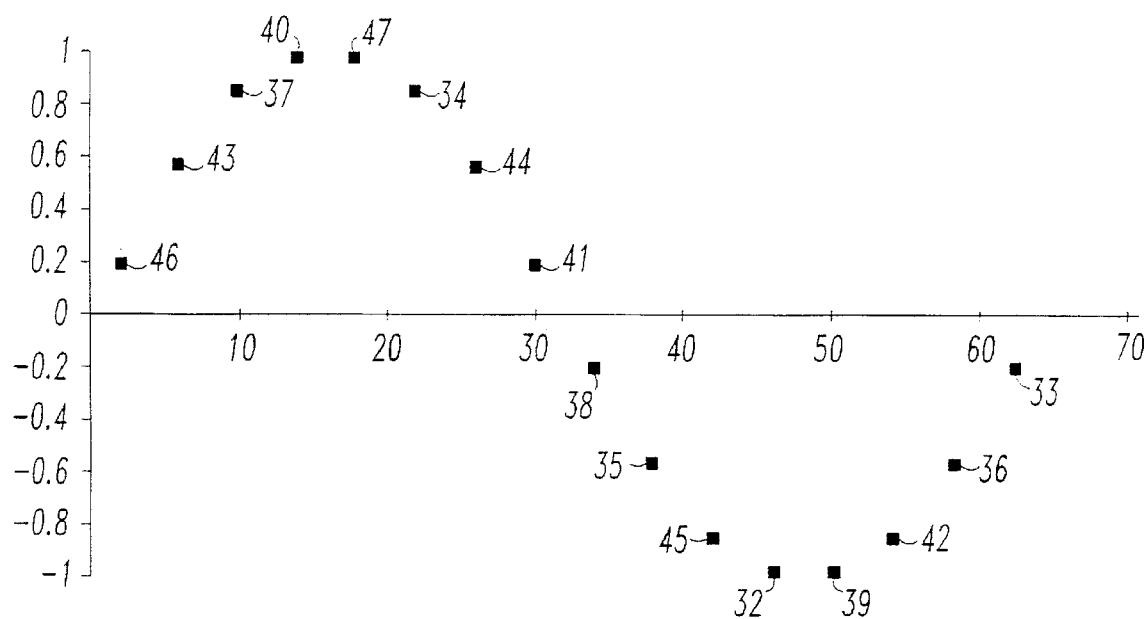
Figure 3D:
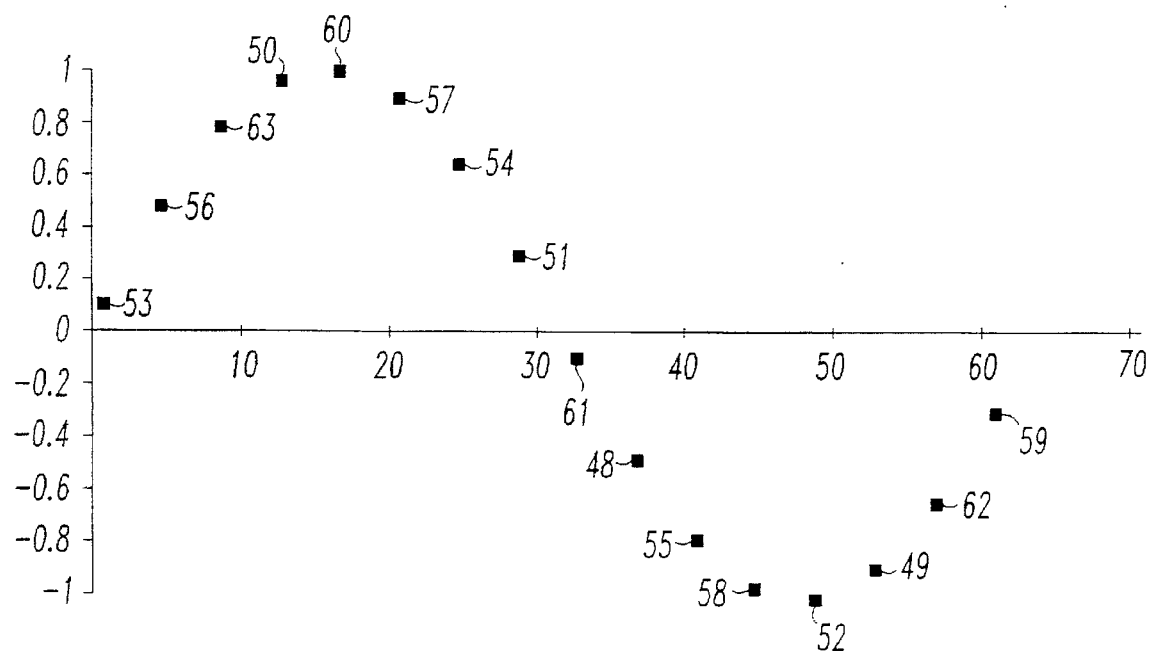

FIGS. 3A, B, C and D illustrate the four repetitions of the sixteen sample per cycle equivalent sampling rate, in which set of each sixteen samples is evenly distributed over the respective equivalent sampling cycle. The sequential number in which the sample is taken is indicated along side of each sample. It will be noted that the four repetitions are phase shifted with respect to one another.

Figure 4:
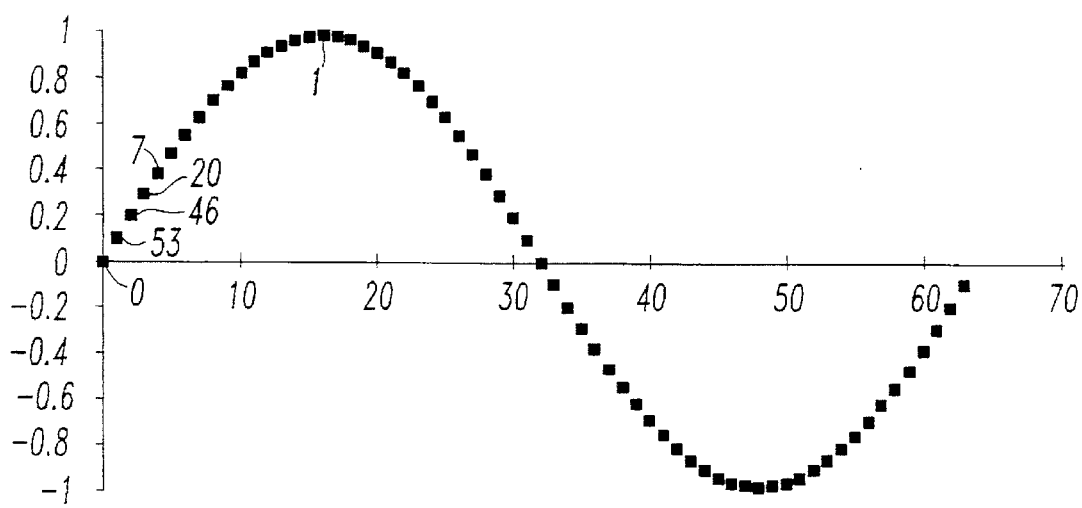
FIG. 4 is a diagram illustrating a full equivalent cycle of sample taken in accordance with the technique of the invention.

FIG. 4 illustrates the distribution of the sixty-four samples taken in accordance with Table 1 superimposed on a single cycle to illustrate the equivalent sampling rate of sixty-four samples per cycle. Each of the samples shown in FIG. 4 can be identified from Table 1. For instance, as indicated, the first sample is the 0 sample, the second sample illustrated is sample number 53 and the third is sample 46, and so forth. The sixty-four sample per cycle equivalent sampling rate of FIG. 4 is the composite of the four repetitions of samples taken at the equivalent rate of sixteen samples per cycle shown in FIGS. 3A–D. This equivalent sampling rate of sixty-four samples per cycle is used in the exemplary apparatus for long delay protection and for metering. The equivalent sampling rate of sixty-four samples per cycle, as can be seen from FIG. 4, provides the capability of responding to distorted waveforms. From the "time" column of Table 1, it can be seen that this high equivalent sampling rate is achieved without placing undo burden on the processor in generating the samples as the shortest interval between individual samples is the 4.16667 ms between samples in each pair.

The sixty-four and sixteen sample per cycle equivalent sampling rates have been illustrated for a 60 Hz fundamental waveform. The distribution of the samples is also provided in terms of electrical degrees as illustrated in the "sin" column of Table 1. This angular distribution can be used to develop the timing for sampling for any other frequency, such as for instance, 50 Hz.

Figure 5A:
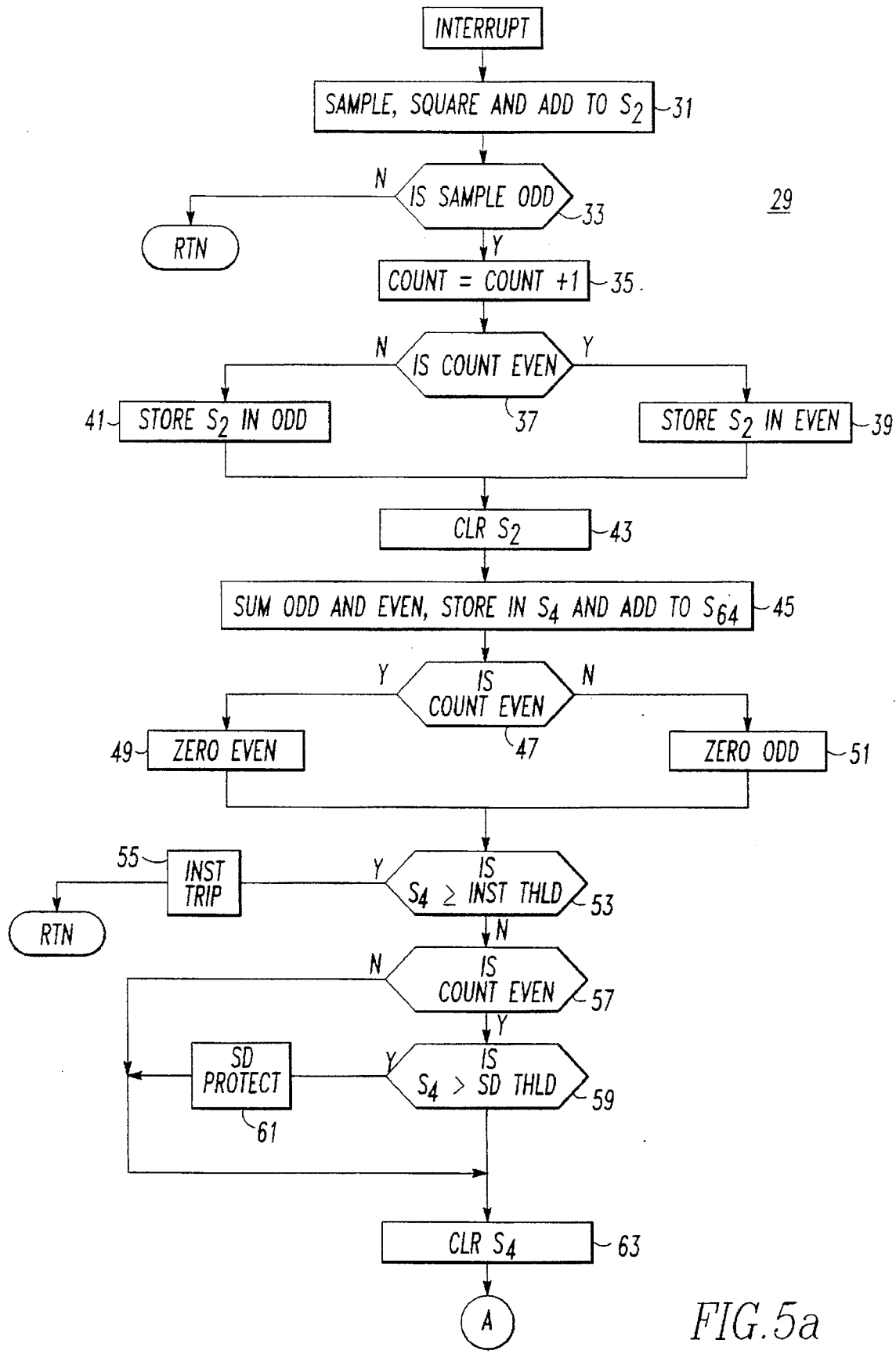
FIG. 5 is a flow chart for a computer routine used by the circuit interrupter of FIG. 1 to implement the invention.
Figure 5B:
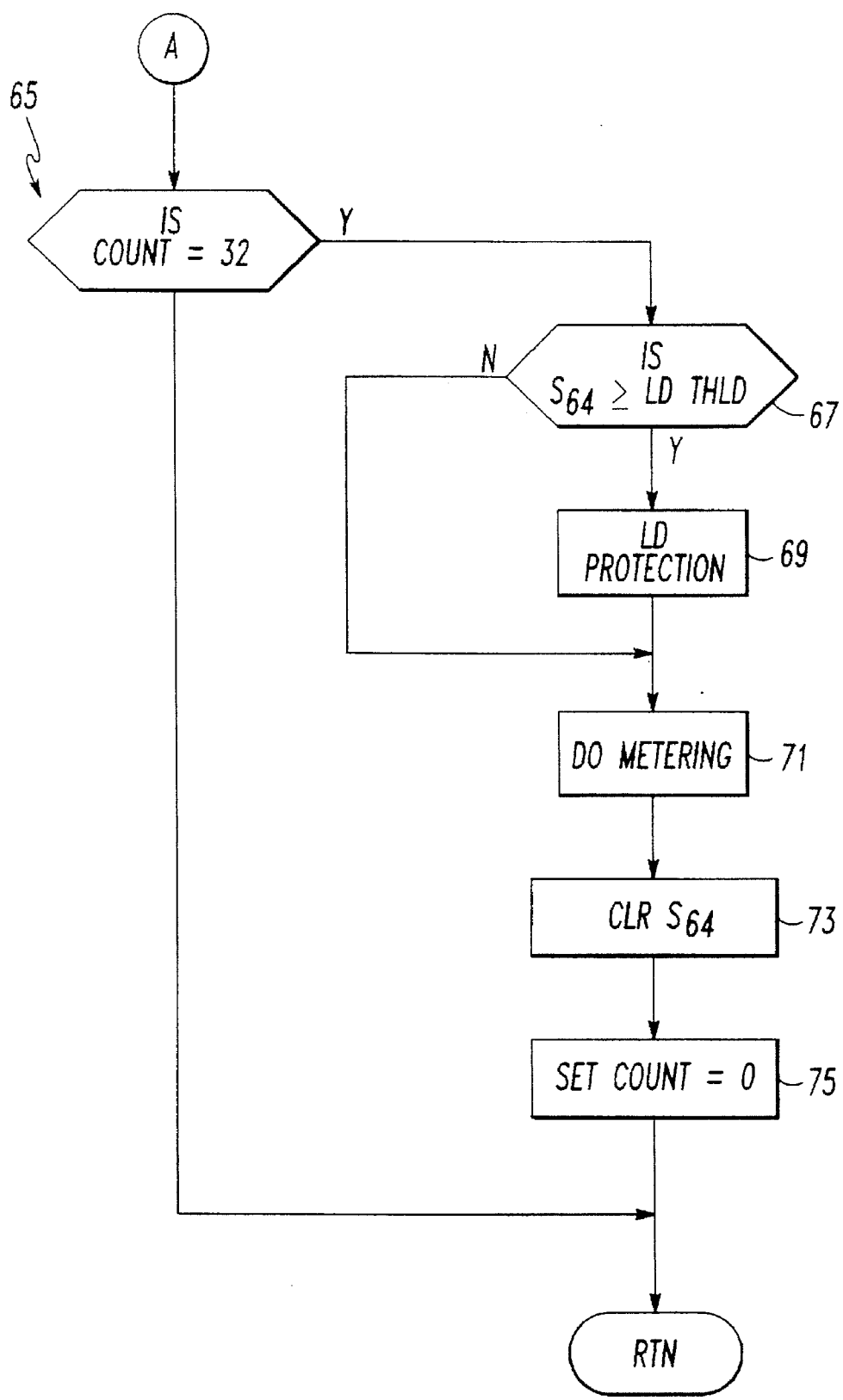

FIGS. 5A and B illustrate an interrupt routine 29 utilized by the digital processor 15 to provide protection and metering utilizing the sampling technique just described. Each time the routine 29 is called, the waveforms are sampled, squared and added to a sum of squares for a pair, $S_2$, at 31. If the sample is not odd at 33 indicating that it is the first sample of a pair, then the routine returns to the main program. On the second sample of a pair (an odd sample), a COUNT is incremented at 35. If the COUNT is even at 37, then the sum of the squares, $S_2$, for the pair is stored in a register called EVEN at 39. On alternate COUNTS, $S_2$ is stored in a register named ODD at 41. The sum of the squares for the pair is then cleared at 43. The contents of the ODD and EVEN registers are then summed at 45 to produce the sum of the squares for the last four samples. This value is stored in $S_4$ and is added to a quantity $S_{64}$ which is an accumulated sum of the sixty-four samples taken at the equivalent sampling rate of sixty-four samples per cycle.

If COUNT is even at 47, then the EVEN registered is zeroed at 49. On ODD counts, the ODD registered is zeroed at 51. If the sum of squares for the most recent two pairs of samples, $S_4$, exceeds a threshold representative of an instantaneous pick-up current at 53, an instantaneous trip routine is called at 55. On alternate counts, i.e., every other sample pair, as determined at 57, the sum of the squares for the two most recent pairs of samples is compared to a threshold representative of the short delay pick-up current at 59. If the short delay pick-up current is exceeded, a short delay protection routine is called at 61. This routine times the interval that the current remains above the short delay pick-up value and generates a trip when this interval exceeds the short delay interval.

After checking instantaneous and short delay protection, the register $S_4$ is cleared at 63. When 64 samples have been taken, as determined at 65 (COUNT records the number of pairs of samples), the accumulated sum of the squares for the sixty-four samples, $S_{64}$, is compared at 67 with a threshold representative of the long delay pick-up value. If this long delay pick-up value is exceeded, a long delay protection subroutine 69 is called. This subroutine generates a trip signal when the long delay time out value has been exceeded.

Following long delay protection, metering is performed at 71. This metering can include generation of RMS values for the currents and voltages, and other metering functions such as calculation of power and energy, as desired. The register $S_{64}$ is then cleared at 73 and the COUNT is reset to 0 at 75 before the program is exited.

Figure 6:
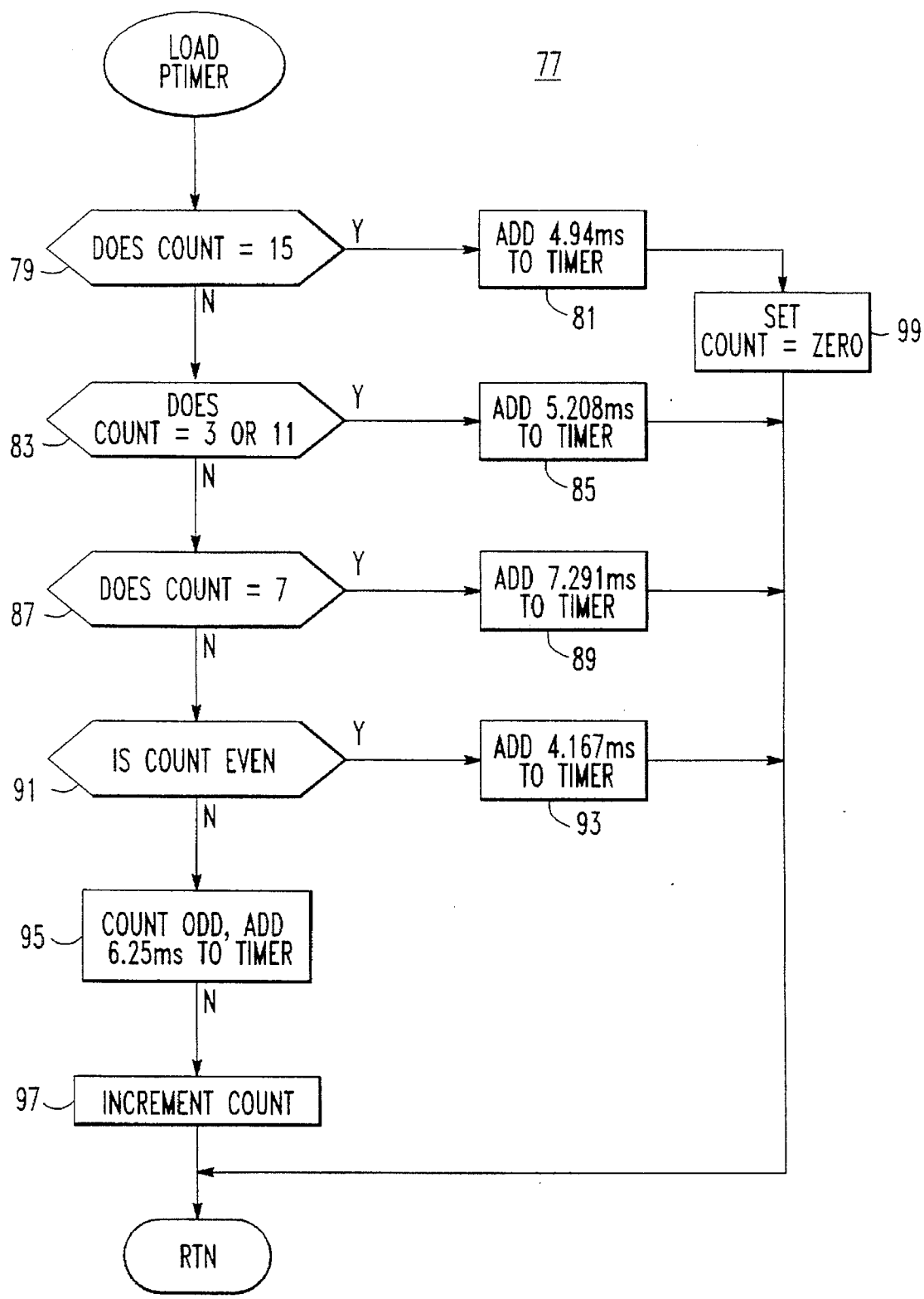
FIG. 6 is a flow chart of a routine used by the circuit interrupter of FIG. 1 to distribute samples in accordance with the invention.

FIG. 6 illustrates a flow chart of a routine 77 used by the digital processor 15 to generate pairs of samples 90° apart and to adjust the time intervals in accordance with the invention between pairs of samples. This is accomplished by loading an interrupt timer. The times illustrated in the exemplary flow chart are for a 60 Hz waveform. A count of the samples is maintained. When the sample just taken is equal to 15 as determined at 79, 4.94 ms is added to the timer at 81. If the count is 3 or 11 as determined at 83, 5.208 ms are added to the timer at 85, and if the count is equal to 7 at 87, 7.291 ms are added to the timer at 89. If the count is even at 91, then 4.167 ms are added to the timer at 93. If the count is not even at 91, then 6.25 ms is added to the timer at 95. The first time the routine is called, the count is 0. Since this is an EVEN count as determined at 91, the 4.167 ms equivalent to 90 electrical degrees is added to the timer at 93 so that the next sample will be taken 90° after the first sample. It should be noted that since every other sample is even, successive pairs of samples 90° apart are generated. The count is incremented at 97 so that the next time a sample is taken, 6.25 ms will be added to the timer at 95 to generate the delay between pairs of samples. When the count is 3 and 11, as determined at 83, the delay is 5.208 ms as indicated at 85. On count 7, the delay is 7.291 ms as indicated at 89. On count 15, 4.94 ms is added to the timer 81 and the count is set to zero at 99. Thus, it can be seen that the adjustments between pairs of samples is repeated after every sixteen samples. However, the sequence does not repeat at the same initial point until after four repetitions of the sixteen samples. Thus, the sixty-four samples are all evenly spaced apart over an equivalent cycle.

The unique sampling technique of the invention provides ample time for the processor to perform the numerous calculations needed for comprehensive protection and metering as the closest the samples are taken is 90 electrical degrees apart. At the same time, it provides a proper accuracy for each of the diverse functions being performed. As instantaneous protection is directed to fault currents which tend to be sinusoidal, the use of paired samples 90 electrical degrees apart provides the needed accuracy. On the other hand, the higher resolution needed for metering and long delay is provided by the high equivalent sampling rate generated by "bumping" the sample pairs.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A circuit interrupter for an ac electrical system comprising:

separable contacts for interrupting current in said ac electrical system when opened;

sensing means sensing waveforms in said ac electrical system including at least one current waveform;

sampling means sampling said ac waveforms sensed by said sensing means at sampling instants to generate digital waveform samples;

means generating said sampling instants in pairs spaced 90 electrical degrees of said ac waveforms apart in time with delays between successive pairs of said sampling instants adjusted to produce a selected equivalent sampling rate per cycle of said ac waveforms after a given number of samples; and processor means for tripping said separable contacts open in response to a predetermined current/time characteristic of said current waveform repetitively determined from said given number of digital current samples taken at said equivalent sampling rate.

2. The circuit interrupter of claim 1 wherein said predetermined current/time characteristic of said current waveform is a long delay current/time characteristic, and wherein said processor means further includes instantaneous trip means tripping said separable contacts open in response to an instantaneous current/time characteristic repetitively determined from said pairs of samples.

3. The circuit interrupter of claim 2 wherein said processor means further includes metering means generating outputs representing power related parameters of said waveform repetitively determined from said given number of digital samples taken at said equivalent sampling rate.

4. The circuit interrupter of claim 2 wherein said instantaneous trip means comprises means tripping said separable contacts open in response to an instantaneous trip current/time characteristic repetitively determined from two pairs of samples which are most recent.

5. The circuit interrupter of claim 4 wherein said processor means further comprises short delay means tripping said separable contacts open in response to a short delay current/time characteristic repetitively determined from a predetermined number of said pairs of samples.

6. The circuit interrupter of claim 5 wherein said short delay means trips said separable contacts open in response to said short delay current/time characteristic repetitively determined from at least two of said pairs of samples.

7. The circuit interrupter of claim 6 wherein said processor means further comprises metering means generating outputs representing power related parameters of said waveform repetitively determined from said given number of digital waveform samples produced at said equivalent sampling rate.

8. The circuit interrupter of claim 1 wherein said means generating said sampling instants comprises means adjusting said delays between successive pairs of sampling instants to produce first and second equivalent sampling rates after first and second given numbers of samples, wherein said processor means trips said separable contacts open in response to a predetermined current/time characteristic repetitively determined from said first given number of digital samples taken at said first equivalent sampling rate, and wherein said processor means further includes metering means generating outputs representing power related parameters of said waveform repetitively determined from said second given number of digital waveform samples produced at said second equivalent sampling rate.

9. A circuit interrupter for an electrical system comprising:

separable contacts for interrupting current in said ac electrical system when opened;

sensing means sensing waveforms in said ac electrical system including at least one current waveform;

sampling means sampling said ac waveforms sensed by said sensing means at sampling instants to generate digital waveform samples;

timing means generating said sampling instants repetitively in pairs with sampling instants in each pair spaced 90 electrical degrees apart, and with delays between successive pairs of samples adjusted to produce a selected equivalent sampling rate after a given number of samples, and with said given number of samples substantially evenly distributed over an equivalent sampling cycle; and processor means comprising means squaring and summing values of samples in each pair to generate a squared pair sum for each pair of samples, means maintaining a running sum of the squared pair sum for each of the two most recent sample pairs, means repetitively generating an accumulated sum calculated by accumulating a sum of said running sum at every other pair of samples for said given number of samples, and means tripping said contacts open when said running sum exceeds a threshold value representative of an instantaneous trip pick-up value and tripping said contacts open when said accumulated sum after said given number of samples exceeds a long delay threshold value representative of a long delay pick-up value for a predetermined period of time to provide long delay protection.

10. The circuit interrupter of claim 9 wherein said processor means further includes short delay protection means tripping said contacts open when said running sum exceeds a threshold value representative of a selected short delay pick-up value on every other pair of samples for a selected short delay interval.

11. The circuit interrupter of claim 9 wherein said processor means includes metering means generating outputs representing power related parameters of said waveforms repetitively generated from said given number of samples taken at said equivalent sampling rate.

12. The circuit interrupter of claim 9 wherein said timing means adjusts said delays between successive pairs of sampling instants such that an equivalent sampling rate of sixty-four samples per cycle is produced after sixty-four samples with said sixty-four samples substantially evenly distributed over said equivalent sampling cycle.

13. The circuit interrupter of claim 12 wherein said timing means adjust said delays between successive pairs of samples such that each sixteen samples are evenly distributed over said equivalent sampling cycle.

* * * * *